(12) United States Patent
Derner (10) Patent No.: US 9,318,187 B2
(45) Date of Patent: Apr. 19, 2016

(54) METHOD AND APPARATUS FOR SENSING IN A MEMORY

(71) Applicant: Micron Technology, Inc., Boise, ID (US)

(72) Inventor: Scott J. Derner, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 185 days.

(21) Appl. No.: 13/948,951

(22) Filed: Jul. 23, 2013

(65) Prior Publication Data

US 2015/0029781 A1    Jan. 29, 2015

(51) Int. Cl.
*G11C 7/00* (2006.01)
*G11C 11/4091* (2006.01)
*G11C 7/06* (2006.01)
*G11C 7/08* (2006.01)

(52) U.S. Cl.
CPC ............ *G11C 11/4091* (2013.01); *G11C 7/062* (2013.01); *G11C 7/08* (2013.01)

(58) Field of Classification Search
CPC ............................ G11C 11/404; G11C 11/405
USPC .......................... 365/149, 205, 206, 207, 208
See application file for complete search history.

(56) References Cited

U.S. PATENT DOCUMENTS 6,757,202 B2 *   6/2004   McElroy ................ G11C 7/065
                                                  365/189.09

* cited by examiner

*Primary Examiner* — Son Dinh
(74) *Attorney, Agent, or Firm* — Schwegman Lundberg & Woessner, P.A.

(57) ABSTRACT

A method and a memory for sensing a state of a memory cell while the memory cell capacitor is isolated from a data line are described. An activation device of the memory cell can be enabled to couple the memory cell capacitor to a parasitic capacitance of the active data line for charge sharing. The activation device can then be disabled to isolate the memory cell capacitor from the active data line. The state of the memory cell can then be sensed while the memory cell capacitor is isolated from the active data line. After the sense operation, the activation device can be re-enabled in order to restore the data to the memory cell capacitor that was destroyed during the sense operation.

23 Claims, 6 Drawing Sheets

METHOD AND APPARATUS FOR SENSING IN A MEMORY

TECHNICAL FIELD

The present embodiments relate generally to sensing in a memory.

BACKGROUND

Memory devices may be provided as internal, semiconductor, integrated circuits in computers or other electronic devices. There can be many different types of memory including non-volatile (e.g., flash) memory, random-access memory (RAM), read only memory (ROM), dynamic random access memory (DRAM), and synchronous dynamic random access memory (SDRAM).

A DRAM cell may include a capacitor coupled to a data line (e.g., digit line) through an access device (e.g., transistor). The capacitor can store a first voltage (e.g., $V_{CC}$) to represent a first logic state (e.g., logic 1) and a second voltage (e.g., ground) to represent a second logic state (e.g., logic 0).

Figure 1:
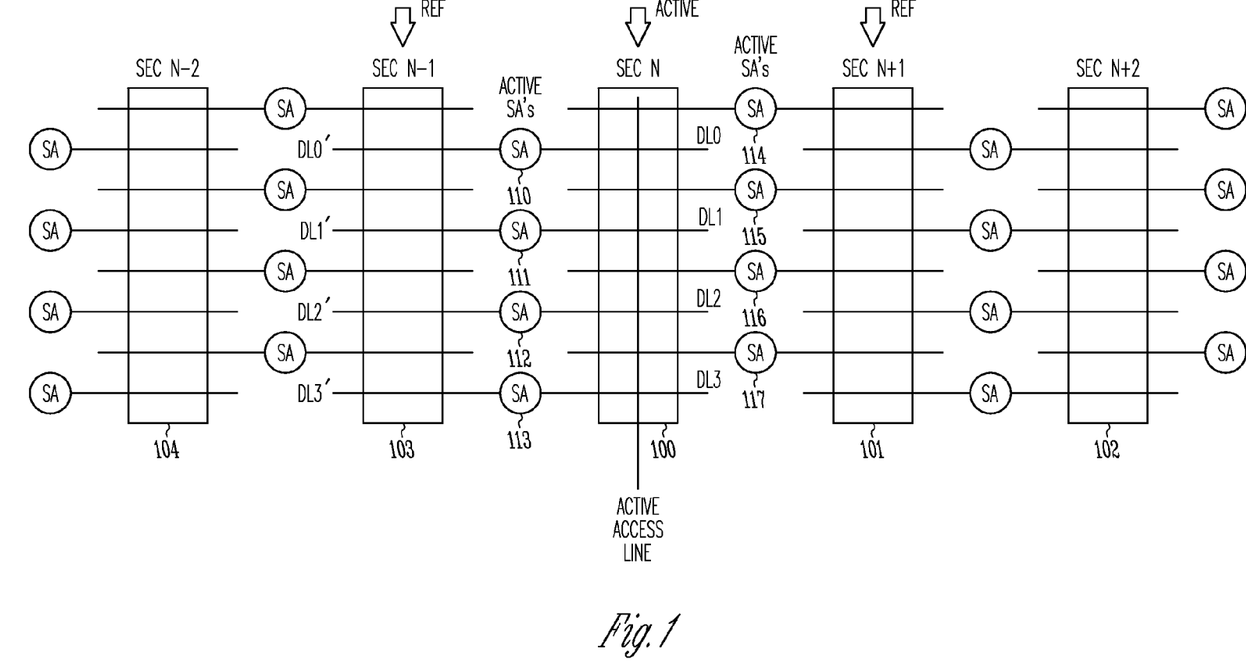
FIG. 1 illustrates a typical DRAM memory array.

FIG. 1 illustrates an embodiment of a typical DRAM array. The DRAM array can include a plurality of groups of memory cells 100-104. Groups of memory cells 100, 101, 103 can be coupled to sense circuits (e.g., sense amplifiers) 110-117 that can sense a voltage stored in an associated memory cell and determine a state of that memory cell. In another embodiment, the sense circuits 110-117 can sense a current from the memory cell to determine the state of the memory cell.

Data lines in a DRAM, for example data lines DL0-DL3 and data lines DL0'-DL3', can be coupled to a large number of memory cells. Even when memory cells are disabled, the memory cells can cause the data line to have a capacitance. During a sense operation, one group of memory cells 100 can be assumed to be the active group of memory cells being sensed and are coupled to data lines DL0-DL3. A second group of memory cells 103 can be assumed to be disabled memory cells and are coupled to data lines DL0'-DL3'. A sense circuits 110-113 can be coupled between DL0-DL3 and DL0'-DL3', respectively.

A typical prior art sense operation to read the state of a memory cell in the active group of memory cells 100 may occur as subsequently described. The memory cell is assumed to be coupled to data line DL0 that is coupled to sense circuit 110. The sense circuit is also coupled to reference data line DL0'.

The active access line (e.g., word line) and sense circuit 110 are off. The data lines DL0 and DL0' are connected to $V_{CC}/2$ for a precharge operation. The memory cell in the active group of memory cells 100 may be assumed to be ideally programmed to either a logic 1 ($V_{CC}$) or a logic 0 (GND).

During access line activation and charge sharing, the data lines DL0 and DL0' are no longer connected to $V_{CC}/2$ so they are floating. Since the data lines DL0 and DL0' have some capacitance value, they remain at $V_{CC}/2$. The access device of the memory cell in the active array is then connected to the data line DL0 in the active group of memory cells 100. The data line DL0' in the reference group of memory cells 103 remains at $V_{CC}/2$ since no access lines are enabled in the reference arrays.

The data line DL0 coupled to the memory cell being sensed begins to move either towards $V_{CC}$ (for logic 1's) or towards GND (for logic 0's). The movement is the result of charge sharing that is occurring between the active DL0 at $V_{CC}/2$ and the memory cell voltage that is either at $V_{CC}$ or GND. Since both the active data line and the memory cell may have about the same capacitance value, the final voltage is almost halfway between $V_{CC}/2$ and either $V_{CC}$ or GND, depending on whether a logic 1 or logic 0 was present in the cell.

During the actual sensing, the sense circuit 110 is enabled after the charge sharing between the active data line DL0 and the memory cell is complete. The sense circuit 110 works by looking at the voltage of the active data line DL0 compared to that of the reference data line DL0'. The reference data line DL0' has ideally remained at $V_{CC}/2$. The active data line DL0 is higher than $V_{CC}/2$ for logic 1's and lower than $V_{CC}/2$ for logic 0's. If enough signal is present on the active data line DL0, the sense circuit 110 may correctly pull the active digit line DL0 to $V_{CC}$ (for logic 1's) and the reference data line DL0' to GND (for logic 1's). For logic 0's, DL0 goes to GND and DL0' goes to $V_{CC}$.

Since the access device in the memory cell is enabled during the entire sensing operation, by default the memory cell gets restored to either $V_{CC}$ or GND by the sense circuit 110. This restores the data back into the cells after the destructive charge sharing event. A read or write operation may be performed at this point and the data lines DL0 and DL0' can then be precharged again.

While both the active and reference sides of the data lines can have an associated parasitic capacitance, the active side of the data line can have the additional memory cell capacitance. This may cause a capacitive imbalance that may result in an inherent sense margin imbalance that favors a sensing of one state over sensing of another state.

DETAILED DESCRIPTION

In the following detailed description, reference is made to the accompanying drawings that form a part hereof and in which are shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

Figure 2:
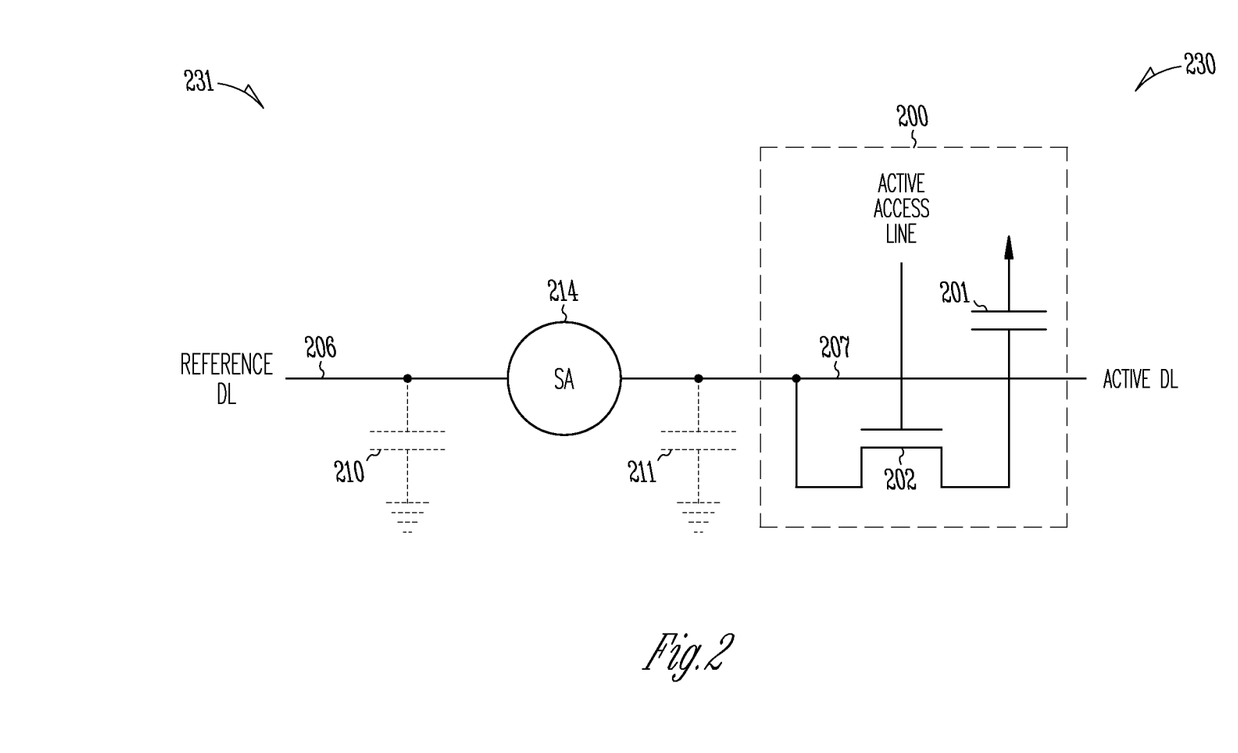
FIG. 2 illustrates a schematic diagram of an embodiment of a memory circuit.

FIG. 2 illustrates a schematic diagram of an embodiment of a memory circuit. The memory circuit comprises a memory cell 200 that includes a capacitor 201 coupled to an activation device (e.g., transistor) 202. A control gate of the activation device 202 can be coupled to an access line (e.g., word line) of a memory array as described subsequently with reference to FIG. 5.

The memory cell 200 may be coupled to a data line 207 through the activation device 202. The data line 207 may be considered to be an active data line 207 since it is part of an active group of memory cells. An active group of memory cells may be a group of memory cells currently being sensed or programmed. The active data line 207 may be coupled to a plurality of additional memory cells that are not shown in FIG. 2. Such a configuration may cause the active data line 207 to have a parasitic capacitance 211. The memory cell 200 may be on a side of a sense circuit 214 considered to be the active side 230 of the sense circuit. An enabled memory cell 200 includes a memory cell capacitor 201 in which its activation device 202 is enabled (e.g., turned on) so that the memory cell capacitor 201 can access the data line 207.

The memory circuit may additionally include an inactive group of memory cells (not shown) on an inactive side 231 (e.g., reference side) of the sense circuit 214. An inactive group of memory cells may be a group of memory cells not currently being accessed and are, thus, disabled (e.g., turned off) during a sense operation.

A reference data line 206 on the inactive side 231 of the sense circuit 214 may be coupled to a plurality of memory cells in the inactive group of memory cells. The inactive memory cells, even though disabled, may still cause a parasitic capacitance 210 on the inactive reference data line 206.

During a sense operation, both the reference data line 206 and the active data line 207 are coupled to $V_{CC}/2$. The control gate of the activation device 202 is biased such that the activation device 202 is off. The sense circuit 214 is also turned off.

Access line activation and charge sharing may then be performed. This can be accomplished by disconnecting the reference data line 206 and the active data line 207 from $V_{CC}/2$ so that they are left floating. Since these data lines 206, 207 have some capacitance, they remain at $V_{CC}/2$.

A voltage can be applied to the control gate of the activation device 202 to enable the activation device 202 and couple the memory cell capacitor 201 to the active data line 207. The reference data line 206 remains at $V_{CC}/2$ since the access lines on the reference side 231 are not enabled.

When the memory cell capacitor 201 is coupled to the active data line 207, the active data line 207 begins to move either towards $V_{CC}$ (for logic 1's) or towards GND (for logic 0's). The movement is the result of charge sharing (e.g., voltage equilibration) between the active data line 207 that was floating at $V_{CC}/2$ and the memory cell capacitor voltage that was either at $V_{CC}$ or GND. Since both the active data line 207 and the memory cell 200 have about the same capacitance value, the final voltage on the active data line 207 will be approximately halfway between $V_{CC}/2$ and either $V_{CC}$ or GND, depending on whether a logic 1 or logic 0 was programmed into the memory cell 200.

In order to compensate for the additional capacitance on the active data line 207 during a sense operation, the memory cell capacitor 201 may be isolated (e.g., decoupled) from the active data line 207 during the actual sense time. This may be accomplished by reducing the control gate voltage (e.g., access line voltage) for the activation device 202. Thus, the effect of the additional capacitance may be removed and the total capacitances on both the active 230 and inactive 231 sides of the sense circuit 214 may be substantially equal prior to enabling the sense circuit 214.

During the sense time, the sense circuit 214 can be enabled after the charge sharing between the active data line 207 and the memory cell capacitor 201 is complete. The sense circuit 214 can operate by comparing the voltage of the active data line 207 to the voltage of the reference data line 206. The reference data line 206 can ideally remain at $V_{CC}/2$. The active data line 207 can be higher than $V_{CC}/2$ for logic 1's and lower than $V_{CC}/2$ for logic 0's. The sense circuit 214 can pull the active data line 207 to $V_{CC}$ (for logic 1's) and the reference data line 206 to GND (for logic 1's). For logic 0's, the active data line 207 can be pulled to GND and the reference data line 206 can be pulled to $V_{CC}$.

Since the access device 202 was disabled during the sensing operation, the memory cell capacitor 201 may not have been restored to $V_{CC}$ or GND by the sense circuit 214. In order to restore the original data to the memory cell capacitor 201, the access device 202 is re-enabled by increasing the control gate of the access device 202 to an enable voltage (e.g., back to its original voltage that was used during the charge sharing time). The sense circuit 214 can then restore either full $V_{CC}$ or GND levels back into the memory capacitor 201 through the access device 202. The active data line 207 and the reference data line 206 can be precharged again.

Figure 3:
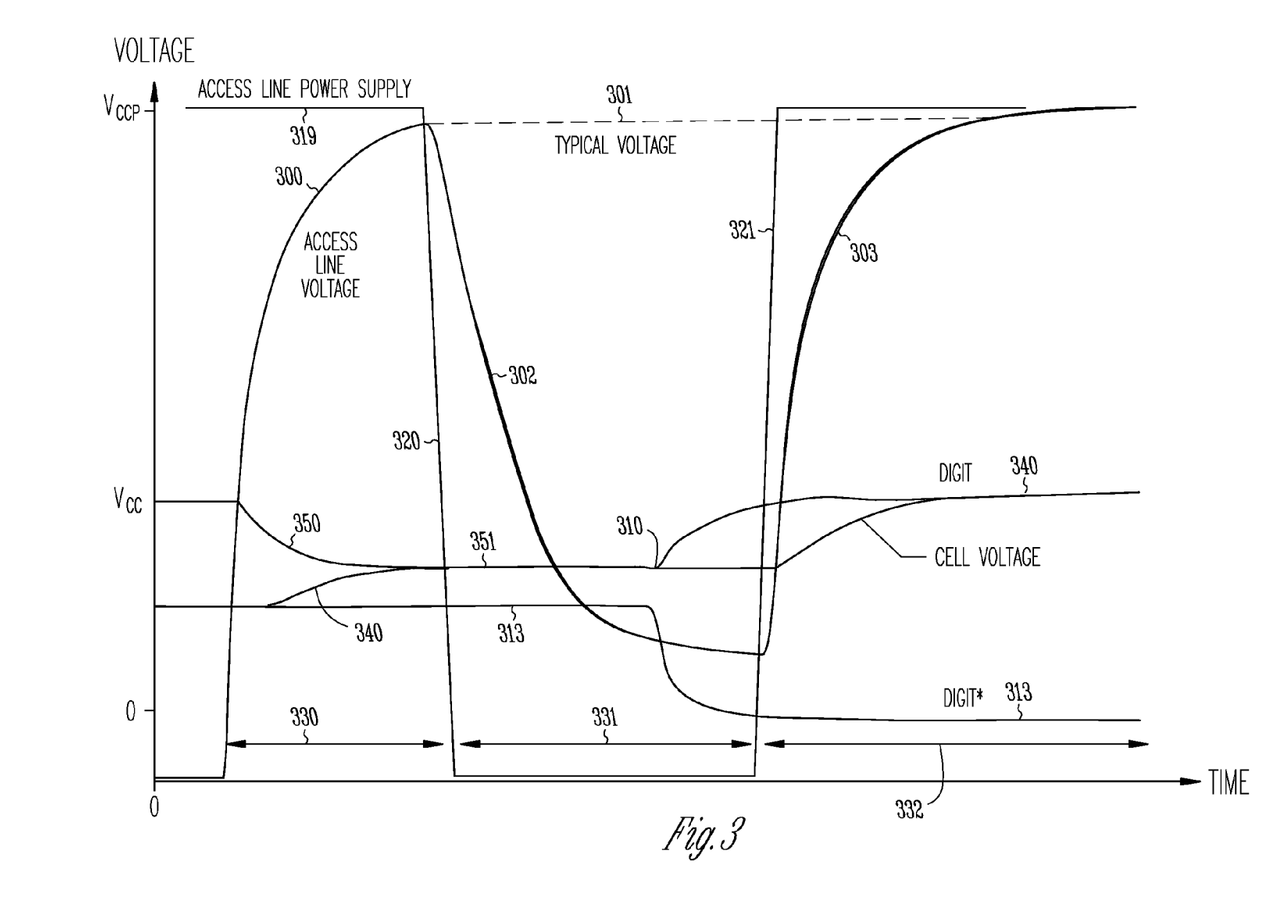
FIG. 3 illustrates a plot of multiple memory circuit voltages versus time of an embodiment of a sense operation using memory cell isolation.

FIG. 3 illustrates a plot of multiple memory circuit voltages versus time of an embodiment of the sense operation using the memory cell isolation. The plot shows the access line power supply voltage 319 (e.g., approximately $V_{CCP}$). This voltage is applied to the control gate of the activation device 202 of the memory cell 200. The actual access line voltage 300 shows a more gradual increase due to the parasitic capacitance caused by a plurality of memory cell access devices coupled to the access line. Once the access line voltage 300 increases to an activation device enable voltage, the activation device 202 turns on and the capacitor 201 of the memory cell 200 may be coupled to the active data line 207. This time may be referred to as the activation time interval 330 as shown on the plot of FIG. 3.

When the activation device 202 is enabled, the memory cell capacitor 201 may be coupled to the parasitic capacitance 211 of the active data line 207. The sense amplifier 214 may still be disabled at this time so that the reference data line 206 may not be coupled to the active data line 207. During this time, charge sharing (e.g., voltage equilibrating) may occur between the memory cell capacitor 201 and the parasitic capacitance 211 of the active data line 207. This is illustrated in FIG. 3 where the cell voltage 350 is shown decreasing while the data line voltage 340 is shown increasing. These voltages 340, 350 may eventually end up at a final voltage 351 that may be in between the starting point of the initial voltages 340, 350.

The embodiment of FIG. 3 illustrates an example where the memory cell 200 may be programmed with a logic 1 (e.g., $V_{CC}$). Thus, the data line voltage 340 is shown increasing to the final voltage 351. However, if the memory cell 200 had been programmed with a logic 0 (e.g., 0V), the cell voltage 350 may be shown as increasing and the data line voltage 340 may be shown decreasing to end up at the final voltage 351.

After the memory cell 200 has been coupled to the active data line 207 and the active data line 207 voltage stabilized, the activation device 202 may be disabled. This may be accomplished by the access line power supply going to a lower voltage 320 that is less than the activation device enable voltage. The actual access line voltage 302 is shown decreasing more gradually due to the parasitic capacitance. Once the actual access line voltage 302 decreases below the activation device enable voltage, the activation device is disabled (e.g., turned off) and the memory cell capacitor 201 may be isolated from the active data line 207. This may be referred to as the isolation time interval 331 as shown on the plot of FIG. 3.

During the isolation time interval 331, the sense circuit 214 may be enabled during a sense circuit turn-on time 310 (e.g., sense operation), as described previously, in order to compare the voltage on the active data line 207 with the voltage on the reference data line 206. Since the memory cell capacitor 201 may be isolated from the active data line total capacitance during the sense circuit turn-on time 310, this capacitance 201 is not a factor during the sensing. The illustrated increase of the final voltage 351 at the sense circuit turn-on time 310 may be a result of the sense circuit 214 pulling the active data line 207 (referred to as DIGIT 340 in FIG. 3) to $V_{CC}$ (for logic 1's) and the reference data line 206 (referred to as DIGIT* 313 in FIG. 3) to GND (for logic 1's). For logic 0's, DIGIT 340 may go to GND and DIGIT* 313 may go to $V_{CC}$. These are the voltages that may be used by the sense circuit 214 to determine a state of the memory cell 200.

FIG. 3 also illustrates a typical access line voltage 301 as may be used in a prior art sense operation. This voltage 301 is shown as being at approximately $V_{CCP}$ during the sense circuit turn-on time 310 such that the memory cell may be coupled to the active data line during the sense operation. As previously described, this will increase the total capacitance of the active data line.

The sense operation may be a destructive process such that the voltage stored in the memory cell capacitance 201 may be substantially reduced when the activation device 202 is enabled and the memory cell 200 coupled to the active data line 207. Thus, as seen in FIG. 3, the access line supply voltage 321 may be turned back on such that the activation device 202 may be enabled again after the sense circuit turn-on time 310 has occurred.

Thus, the actual access line voltage 303 again increases to the point where the activation device enable voltage is reached. Activating the activation device 202 after the sense circuit turn-on time 310 enables the original data to be written back into the memory cell capacitor 201 after the destructive sense operation. This may be referred to as the restoration time interval 332 as shown on the plot of FIG. 3.

In an embodiment, the memory is a differential voltage memory. This is shown in FIG. 3 by the DIGIT voltage 340 and the DIGIT* 313 voltage. However, the present embodiments are not limited to differential voltages.

The embodiment illustrated in FIG. 3 can represent the use of a voltage sense circuit. However, a substantially similar embodiment of FIG. 3 can represent the use of a current sense circuit.

Figure 4:
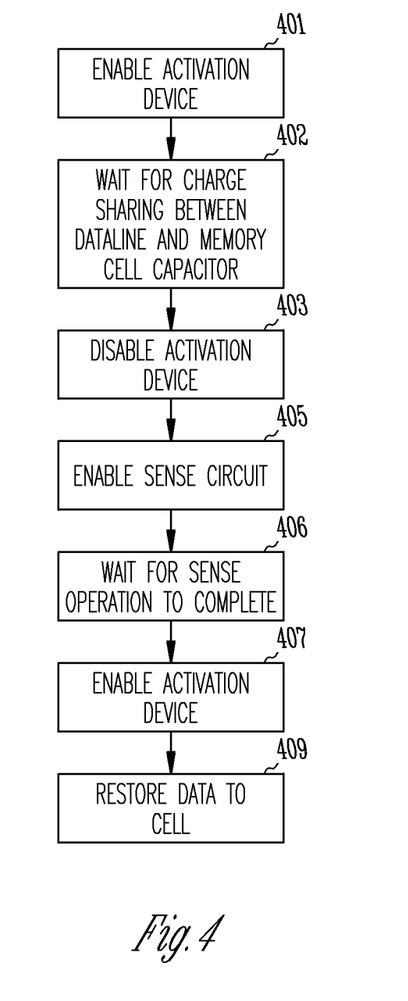
FIG. 4 illustrates a flow chart of an embodiment of a method for sensing using memory cell isolation in accordance with the embodiment of FIGS. 2 and 3.

FIG. 4 illustrates a flow chart of an embodiment of a method for sensing with memory cell isolation, in accordance with the embodiments of FIGS. 2 and 3. The activation device 202 of the memory cell 200 may be enabled 401 to couple the memory cell capacitor 201 to the active data line 207. The method then waits 402 for the charge sharing between the memory cell capacitor 201 and the active data line 207. The activation device 202 may then be disabled 403.

The sense circuit 214 may then be enabled 405. The enablement of the sense circuit 214 may compare the voltage of the active data line 207 with the voltage of the reference data line 206 while the memory cell capacitor 201 is isolated from the active data line 207. The sense circuit 214 can then determine a state of the memory cell 200. The method may then wait for the sense operation to be completed 406.

After the memory cell 200 has been sensed, the activation device 202 may then be enabled 407 (e.g., re-enabled). The memory cell 200 may be coupled to the active data line 207 again so that the memory cell 200 can be accessed. The data in the memory cell 200 can then be restored 409 to the state it was in prior to the sense operation by reprogramming the original data.

Figure 5:
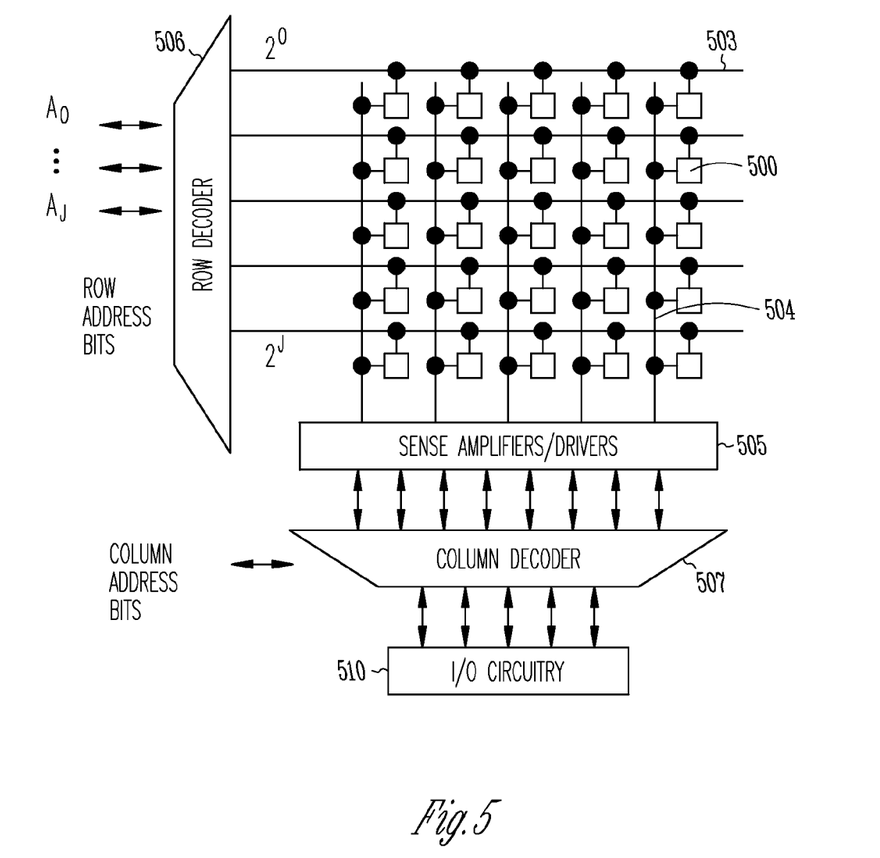
FIG. 5 illustrates a block diagram of an embodiment of a DRAM.

FIG. 5 illustrates a block diagram of an embodiment of a memory device (e.g., DRAM) that can incorporate the method for sensing a memory. The device comprises a plurality of memory cells 500 (e.g., an array of memory cells), each memory cell 500 being coupled between an access line (e.g., word line) 503 and a data line (e.g., digit line) 504.

The data lines 504 are coupled to sense circuits/drivers 505 that can sense the states of the memory cells 500. The sensing can occur through sense circuits 505 when the memory cell capacitors are coupled to the data lines through their respective enabled activation devices.

A row decoder 506 is coupled to the access lines 503 to generate the access line signals in response to a row address from a controller (not shown in FIG. 5). A column decoder 507 is coupled to the sense circuits/drivers 505 and generates a column address through drivers onto the data lines 504 in response to a column address from the controller. The column decoder 507 also outputs the sensed states from the memory cells 500 as well as accepts the data to be stored in the memory cells 500.

The outputs from the column decoder 507 are input to the input/output (I/O) circuitry 510. The I/O circuitry 510 can include data pad (e.g., DQ) I/O circuitry.

Figure 6:
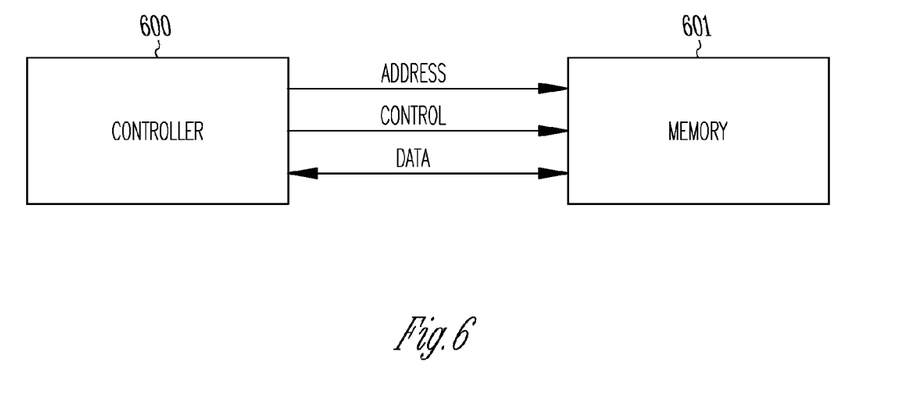
FIG. 6 illustrates a block diagram of an embodiment of a system.

FIG. 6 illustrates a block diagram of an embodiment of a system, in accordance with the embodiment of FIG. 5. The system can include a controller 600 (e.g., control circuitry, microprocessor) coupled to a memory 601 over address, control, and data buses. In one embodiment, the controller 600 and memory 601 are part of the same DRAM device. In another embodiment, the memory 601 is part of a memory device and the controller 600 is a separate integrated circuit. The controller 600 may be configured to execute the embodiments of the method for sensing described herein.

CONCLUSION

One or more embodiments can provide improved data margin during a sense operation by balancing the capacitance values of the active and reference digit lines prior to activating the sense circuits. The activation device can be disabled to isolate the memory cell capacitor from the active data line after the charge sharing between the memory cell capacitor and the parasitic capacitance of the active data line. The state of the memory cell can then be sensed. After the sense operation, the activation device can then be re-enabled in order to restore the data in the memory cell capacitor that was destroyed during the sense operation.

Although specific embodiments have been illustrated and described herein, it will be appreciated by those of ordinary skill in the art that any arrangement that is calculated to achieve the same purpose may be substituted for the specific embodiments shown. Many adaptations will be apparent to those of ordinary skill in the art. Accordingly, this application is intended to cover any adaptations or variations.

What is claimed is:

1. A method for sensing a memory cell, the method comprising:
   coupling a memory cell capacitor to a data line;
   decoupling the memory cell capacitor from the data line; and
   sensing a state of the memory cell while the memory cell capacitor is decoupled from the data line.

2. The method of claim 1 and further comprising:
   recoupling the memory cell capacitor to the data line after sensing the state of the memory cell; and
   restoring the state to the memory cell.

3. The method of claim 1 wherein the data line is a first data line and the method further comprises coupling the first data line and a second data line to a voltage prior to coupling the memory cell to the first data line.

4. The method of claim 3 wherein sensing the state of the memory cell comprises comparing a voltage between the first data line and the second data line.

5. The method of claim 4 and further comprising disabling a plurality of memory cells coupled to the second data line.

6. The method of claim 1 wherein coupling the memory cell capacitor to the data line comprises enabling an activation device of the memory cell such that the memory cell capacitor is coupled to the data line through the activation device after the activation device is enabled.

7. The method of claim 1 and further comprising waiting for charge sharing to occur between the memory cell capacitor and the data line after coupling the memory cell capacitor to the data line.

8. The method of claim 7 wherein the charge sharing between the data line and the memory cell capacitor comprises voltage equilibration between the data line and the memory cell capacitor.

9. A method for sensing a memory cell, the method comprising:
  enabling the memory cell such that charge sharing occurs between a memory cell capacitor and an active data line;
  disabling the memory cell after the charge sharing;
  comparing a voltage or current on the active data line with a voltage or current on a reference data line to determine a state of the memory cell while the memory cell is disabled; and
  restoring original data to the memory cell capacitor.

10. The method of claim 9 wherein restoring the original data to the memory cell capacitor comprises:
  enabling an activation device of the memory cell; and
  programming the state of the active data line to the memory cell.

11. The method of claim 9 wherein enabling the memory cell such that charge sharing occurs between a memory cell capacitor and the active data line comprises causing a voltage on the active data line and a voltage on the memory cell capacitor.

12. The method of claim 9 wherein comparing the voltage on the active data line with the voltage on the reference data line comprises a sense circuit increasing the voltage on the active data line responsive to a logical 1 state stored in the memory cell.

13. The method of claim 9 wherein comparing the voltage on the active data line with the voltage on the reference data line comprises a sense circuit decreasing the voltage on the active data line responsive to a logical 0 state stored in the memory cell.

14. A memory comprising:
  an array of memory cells comprising a plurality of data lines, a memory cell of the array of memory cells comprising an activation device and a memory cell capacitor; and
  circuitry coupled to the array of memory cells, the circuitry configured to enable the activation device, disable the activation device after charge sharing between the memory cell capacitor and a data line has occurred, and activate a sense circuit to sense a state of the memory cell while the memory cell capacitor is isolated from the data line.

15. The memory of claim 14 wherein the circuitry is configured to enable charge sharing between the memory cell capacitor and a parasitic capacitance of the data line by enabling the activation device.

16. The memory of claim 14 wherein, during a sense operation, the array of memory cells comprises active memory cells with active data lines and reference memory cells with reference data lines, the memory cell being an active memory cell and the data line being an active data line, wherein the sense circuit is configured to compare a voltage on the active data line to a voltage on a reference data line while the memory cell capacitor is isolated from the active data line.

17. The memory of claim 16 wherein the reference data line is coupled to a plurality of disabled memory cells and comprises a parasitic capacitance.

18. The memory of claim 14 wherein the circuitry is configured to control an increase of a voltage of the data line, responsive to a logical 1 being stored in the memory cell, prior to disabling the activation device.

19. The memory of claim 14 wherein the circuitry is configured to control a decrease of a voltage of the data line, responsive to a logical 0 being stored in the memory cell, prior to disabling the activation device.

20. A method for sensing a memory cell, the method comprising:
  applying a signal to a gate of an activation device of the memory cell such that the signal includes a first voltage level during a first time interval and a second voltage level during a second time interval, wherein the first voltage level is different from the second voltage level;
  sensing a state of the memory cell during the second time interval; and
  restoring the state to the memory cell during a third time interval when the signal is at a third voltage level wherein the third voltage level is substantially equal to the first voltage level.

21. The method of claim 20 and further comprising equilibrating voltages between a capacitor of the memory cell and a data line during the first time interval responsive to the first voltage level.

22. The method of claim 20 and further comprising isolating the memory cell from a data line during the second time interval while sensing the state of the memory cell.

23. The method of claim 22 wherein isolating the memory cell from the data line comprises disabling an activation device of the memory cell responsive to the second voltage level.

* * * * *